United States Patent
Ishihara

(10) Patent No.: US 8,222,058 B2
(45) Date of Patent: Jul. 17, 2012

(54) METHOD FOR PRODUCING SEMICONDUCTOR OPTICAL DEVICE

(75) Inventor: Kuniaki Ishihara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 63 days.

(21) Appl. No.: 12/801,026

(22) Filed: May 17, 2010

(65) Prior Publication Data
US 2010/0297795 A1    Nov. 25, 2010

(30) Foreign Application Priority Data
May 21, 2009    (JP) .................. 2009-123337

(51) Int. Cl.
*H01L 21/00* (2006.01)
(52) U.S. Cl. ......................................................... 438/26
(58) Field of Classification Search .................. 438/26
See application file for complete search history.

(56) References Cited

U.S. PATENT DOCUMENTS

| | | | |
|---|---|---|---|
| 6,265,137 B1 * | 7/2001 | Hirukawa | 430/312 |
| 2008/0013061 A1 * | 1/2008 | Kato | 355/53 |
| 2008/0044128 A1 * | 2/2008 | Kish et al. | 385/14 |
| 2008/0180646 A1 * | 7/2008 | Colburn et al. | 355/46 |
| 2008/0211063 A1 * | 9/2008 | Adachi et al. | 257/620 |
| 2008/0299247 A1 * | 12/2008 | Ogino et al. | 425/471 |

OTHER PUBLICATIONS

Chou et al., "Imprint of sub-25 nm vias and trenches in polymers", Appl. Phys. Lett. 67(21), 1995, pp. 3114-3116.

* cited by examiner

*Primary Examiner* — Charles Garber
*Assistant Examiner* — Andre' C Stevenson
(74) *Attorney, Agent, or Firm* — Smith, Gambrell & Russell, LLP

(57) ABSTRACT

A method for producing a semiconductor optical device, includes the steps of: forming a semiconductor region including a semiconductor layer on a substrate; preparing a mold including a pattern surface, the pattern surface including an arrangement of patterns each including first to n-th pattern portions; forming a first mask on the semiconductor region with the mold by a nano-imprint technique; forming first to n-th periodic structures in each of the device sections in the semiconductor region by using the first mask, the first to n-th periodic structures respectively corresponding to the first to n-th pattern portions; forming a second mask after the first mask is removed, the second mask including a first pattern on an i-th periodic structure ($1 \leq i \leq n$) among the first to n-th periodic structures in a first section of the device sections and including a second pattern on a j-th periodic structure ($1 \leq j \leq n$) among the first to n-th periodic structures in a second section of the device sections; and forming first and second stripe mesas in the first and second sections respectively by using the second mask.

14 Claims, 15 Drawing Sheets

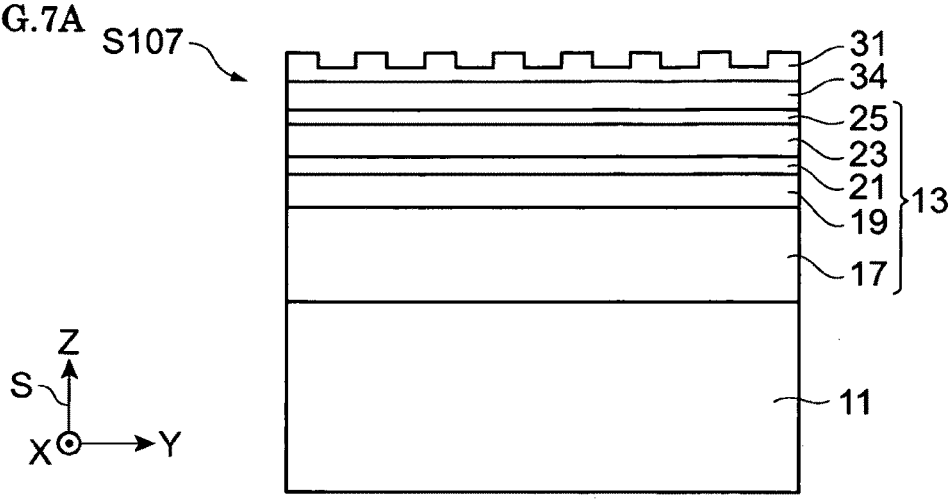
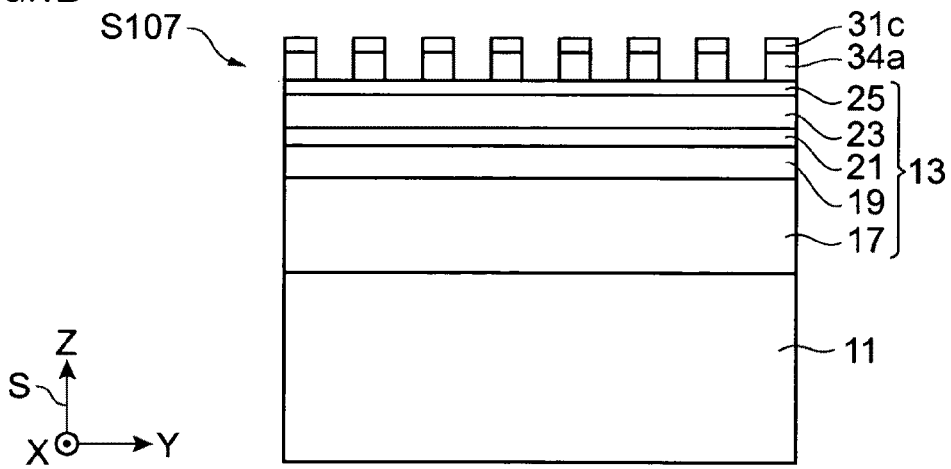
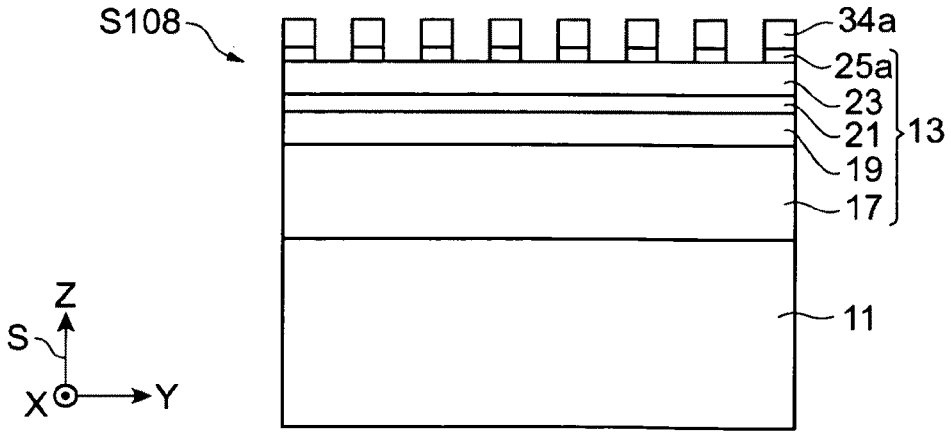

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Description of the Related Art

Non-Patent Document 1 (S. Y. Chou, P. R. Krauss and P. J. Penstrom, Applied Physics Letters, vol. 67 (1995) pp. 3114-3116) describes a nano-imprint technique. Specifically, a poly methylmethacrylate (PMMA) resin is coated on a silicon substrate and the resultant PMMA resin is heated to the glass transition temperature (105° C.) of the PMMA resin or higher. The heated PMMA resin is pressed with a quartz mold on which a predetermined pattern has been formed. After the PMMA resin and the quartz mold are cooled, the PMMA resin is removed from the quartz mold. Thus, as a result of the transfer of the pattern of the quartz mold to the PMMA resin, the patterned PMMA resin is provided. The silicon substrate is etched by using the patterned PMMA resin as an etching mask. For example, such a pattern includes cylindrical portions having a diameter of 25 nm and a depth of 100 nm.

SUMMARY OF THE INVENTION

In the production of semiconductor optical devices including diffraction gratings, a nano-imprint technique can be used as a patterning technique for forming the diffraction gratings. In designing a mold for forming the diffraction gratings by using the nano-imprint technique, the period (pitch) and the duty ratio (ratio of the width of projections to the period) are important parameters. The mold used for forming the diffraction gratings has a diffraction grating pattern with a predetermined period and a predetermined duty ratio on the surface. If the grating parameters such as the pitch and the duty ratio change, it is necessary to design and produce another mold. Furthermore, after transferring the diffraction grating pattern of the mold to a resin, the transferred diffraction grating pattern can not be changed. Therefore, a plurality of molds having desired grating parameters such as the pitch and the duty ratio must be prepared to adapt to the various designs of the diffraction gratings. Furthermore, in the process of formation of the diffraction grating, molds having the desired grating parameters must be exchanged. Accordingly, a high throughput that is one of the advantages of a nano-imprint technique is not sufficiently achieved.

As described in Non-Patent Document 1, a nano-imprint technique is performed in the following manner. A mold having a pattern is prepared. The pattern is formed on the surface of the mold. The mold is pressed on a softened resin formed on a substrate. Then, the pattern formed on the surface of the mold is transferred to the resin. Next, the resin is cured to form the pattern on the resin. The pattern of the resin is finally transferred to a substrate by etching. In such a nano-imprint technique, a pattern to be formed is restricted to the pattern having been formed in a mold. Therefore, the pattern formed on the resin by using this mold can not be changed or adjusted. Accordingly, the production of another mold is necessary to form a diffraction grating having a different structure. When a plurality of diffraction gratings with different structures are to be formed, one of the following techniques is performed.

(a) A plurality of molds corresponding to the diffraction grating patterns are prepared.

(b) A predetermined diffraction grating pattern (a single diffraction grating pattern) is formed for each optical device (for example, semiconductor laser) chip in a single mold.

However, the technique (a) requires preparation of a large number of molds and management of the molds in the production of optical devices. As for the technique (b), optical devices are not necessarily produced with all the patterns having been transferred from the mold and hence there are waste regions in the production of the optical devices.

An aspect of the present invention is a method for producing a semiconductor optical device. This method includes the steps of: (a) forming a semiconductor region including a semiconductor layer on a substrate, the substrate including a principal surface, the principal surface including a device area including device sections arranged in rows and columns; (b) preparing a mold including a pattern surface, the pattern surface including an arrangement of patterns each including first to n-th pattern portions; (c) forming a first mask on the semiconductor region with the mold by a nano-imprint technique; (d) forming first to n-th periodic structures in each of the device sections in the semiconductor region by using the first mask, the first to n-th periodic structures respectively corresponding to the first to n-th pattern portions; (e) forming a second mask after the first mask is removed, the second mask including a first pattern on an i-th periodic structure ($1 \leq i \leq n$) among the first to n-th periodic structures in a first section of the device sections and including a second pattern on a j-th periodic structure ($1 \leq j \leq n$) among the first to n-th periodic structures in a second section of the device sections; and (f) forming first and second stripe mesas in the first and second sections respectively by using the second mask. The first to n-th periodic structures are arranged adjacent to one another in the direction of the rows. The first to n-th periodic structures each extend in the direction of the columns.

According to this method, the pattern surface of the mold includes first to n-th pattern portions. The second mask used for forming stripe mesas includes a first pattern on a first desired periodic structure (i-th) among the first to n-th periodic structures in a first section of the device sections and includes a second pattern on a second desired periodic structure (j-th) among the first to n-th periodic structures in a second section of the device sections. The first to n-th periodic structures may include projections and recesses periodically arranged so as to form diffraction gratings. According to the method, in the production of devices, a mold including pattern portions for forming periodic structures of a plurality of types in a region in which a single device is to be formed is used. For example, when periodic structures include diffraction grating structures, a desired diffraction grating pattern can be selected from a plurality of diffraction grating patterns formed in a region in which a single device is to be formed. Therefore, there are no waste regions.

In the above-described method according to the present invention, at least one pattern portion among the first to n-th pattern portions of the mold may be different from another pattern portion among the first to n-th pattern portions. And, at least one periodic structure among the first to n-th periodic structures may be different from another periodic structure among the first to n-th periodic structures. According to the method, a desired periodic structure may be formed by selecting a desired periodic structure from the different periodic structures.

The above-described method according to the present invention may further include the following features: the second mask includes openings above periodic structures other than the i-th periodic structure in the first section of the device sections and above periodic structures other than the j-th periodic structure in the second section of the device sections; the periodic structures other than the i-th periodic structure in the first section are removed upon formation of the first and second stripe mesas; and the periodic structures other than the j-th periodic structure in the second section are removed upon the formation of the first and second stripe mesas. The above-described method according to the present invention preferably further includes a step of growing a buried layer for burying the first and second stripe mesas.

According to this method, periodic structures other than the periodic structures included in the stripe mesas are removed and the stripe mesas including the desired periodic structures are buried with the buried layer. Therefore, when a mold according to the present invention is used, such a buried structure can be employed.

The above-described method according to the present invention may further include a step of forming an alignment mark in the semiconductor region in an accessory area in the principal surface. In this case, the mold is aligned with reference to the alignment mark in the step of forming the first mask and the second mask is formed with reference to the alignment mark.

According to this method, the alignment of the mold and the alignment of the second mask are conducted with reference to the common alignment mark. Thus, the positions of the pattern portions in the mold can be associated with the positions of the desired periodic structures.

In the above-described method according to the present invention, the semiconductor region may include a first optical waveguide layer, an active layer, a second optical waveguide layer, and a diffraction grating layer. The first and second stripe mesas may include the first optical waveguide layer, the active layer, the second optical waveguide layer, and the diffraction grating layer; and the periodic structures may include projections and recesses periodically arranged so as to form, for example, diffraction gratings and the periodic structures may be formed in the diffraction grating layer.

In the above-described method according to the present invention, the first to n-th periodic structures may include projections and recesses periodically arranged so as to form diffraction gratings; and a k-th pattern portion among the first to n-th pattern portions of the mold may be different from an m-th pattern portion (k is not equal to m) among the first to n-th pattern portions in terms of at least one property of period and a presence or absence of a phase-shift region.

According to this method, the pattern surface of a single mold can include pattern portions that are different from each other in terms of at least one property of diffraction gratings among the period and the presence or absence of a phase-shift region. Thus, diffraction gratings having different characteristics can be formed on the same substrate.

In the above-described method according to the present invention, the first to n-th periodic structures may include projections and recesses periodically arranged so as to form diffraction gratings; and the first to n-th periodic structures may have different structures from one another in terms of at least one property among period, a duty ratio, and a presence or absence of a phase-shift region. Accordingly, the i-th periodic structure among the first to n-th periodic structures is different from the j-th periodic structure in terms of at least one property among the period, the duty ratio, and the presence or absence of a phase-shift region. According to this method, the diffraction gratings of the first and second stripe mesas have characteristics different from each other.

In the above-described method according to the present invention, the first pattern of the second mask may be formed on the i-th periodic structure ($1 \leq i \leq n$) among the first to n-th periodic structures in the first section of the device sections and the second pattern of the second mask may be formed on the j-th periodic structure ($1 \leq j \leq n$, $i \neq j$) among the first to n-th periodic structures in the second section of the device sections.

According to this method, different periodic structures can be formed for different device sections in the production step with a single mold including a pattern surface including pattern portions for forming different periodic structures.

The above-described method according to the present invention may further include a step of forming an insulator layer over the first and second stripe mesas, the insulator layer including openings positioned above the first and second stripe mesas; and a step of, after the formation of the insulator layer over the first and second stripe mesas, forming first and second electrodes on the one or more semiconductor layers in accordance with positions of the first (i-th) and second (j-th) desired periodic structures.

According to this method, different periodic structures can be formed on a single substrate with a single mold including a pattern surface including pattern portions for forming different periodic structures. Additionally, the positions and/or orientations of the electrodes can be changed in accordance with the positions of the periodic structures.

In the above-described method according to the present invention, the first pattern of the second mask may be formed on the i-th periodic structure ($1 \leq i \leq n$) among the first to n-th periodic structures in the first section of the device sections; and the second pattern of the second mask may be formed on the j-th periodic structure ($1 \leq j \leq n$, i is equal to j) among the first to n-th periodic structures in the second section of the device sections.

According to this method, pattern portions used can be selected in the production step with a single mold including a pattern surface including pattern portions for forming different periodic structures. Therefore, different semiconductor optical devices having individual characteristics can be produced with a single mold.

An object, another object, features, and advantages of the present invention will be more readily understood with the following detailed description of preferred embodiments according to the present invention with reference to the attached drawings.

BRIEF DESCRIPTION OF THE DRAWINGS

FIGS. 7A to 7C are schematic views illustrating major steps in a method for producing a semiconductor optical device according to the embodiment, the step shown in FIG. 7A being performed after the step shown in FIG. 6B;

DESCRIPTION OF THE PREFERRED EMBODIMENTS

Figure 1:
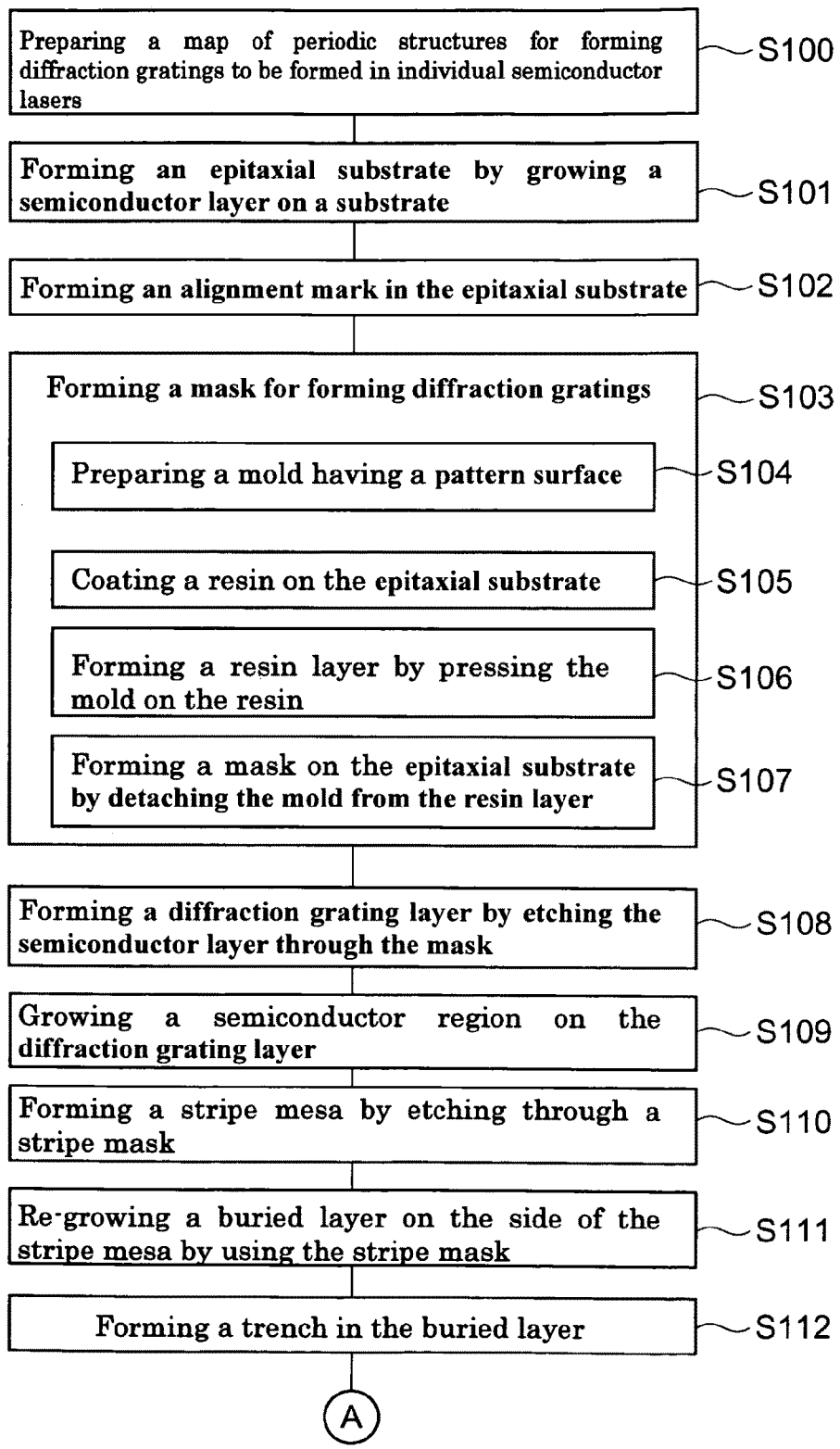
FIG. 1 is a flow chart illustrating major steps in a method for producing a semiconductor optical device according to an embodiment of the present invention.

The findings of the present invention can be readily understood in consideration of the following detailed description with reference to the attached drawings illustrated as examples. Hereinafter, a method for producing a semiconductor optical device according to an embodiment of the present invention will be described with reference to the attached drawings. When possible, like elements are denoted with like reference numerals.

Figure 2:
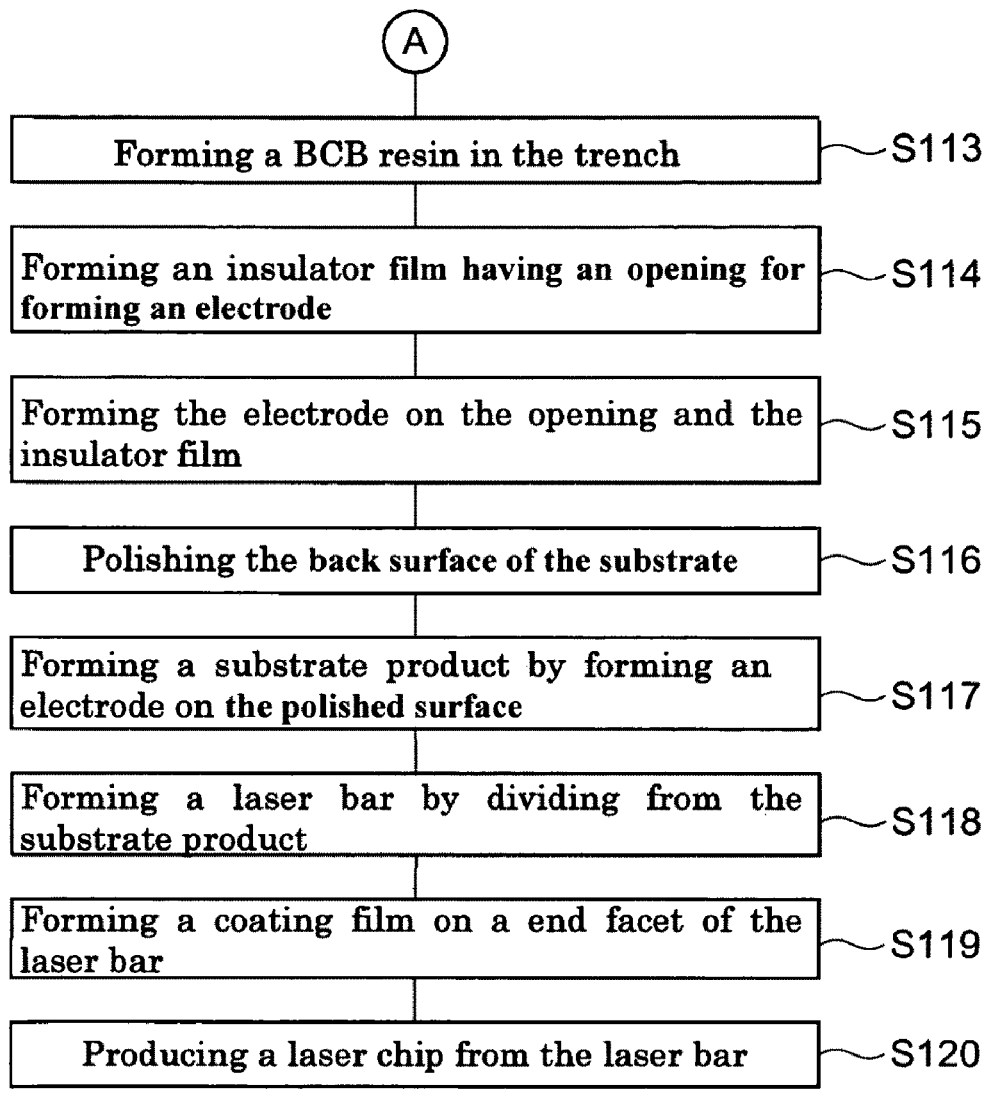
FIG. 2 is a flow chart illustrating major steps in a method for producing a semiconductor optical device according to the embodiment, the steps shown in FIG. 2 being performed after the steps shown in FIG. 1.
Figure 3A:
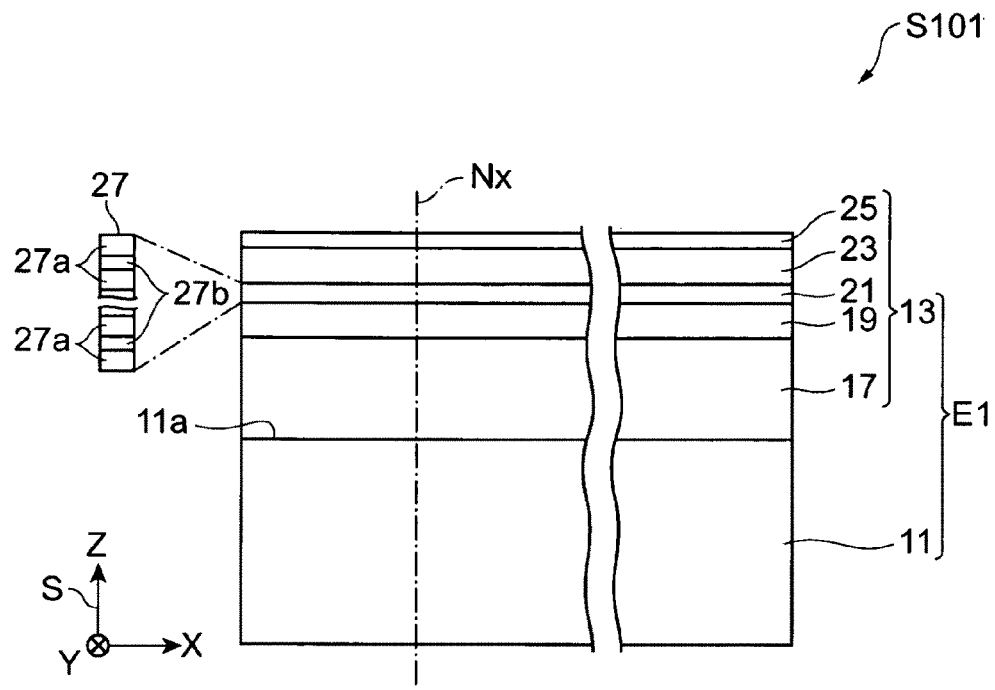
FIGS. 3A and 3B are schematic views illustrating major steps in a method for producing a semiconductor optical device according to the embodiment, the step shown in FIG. 3B being performed after the step shown in FIG. 3A.
Figure 3B:
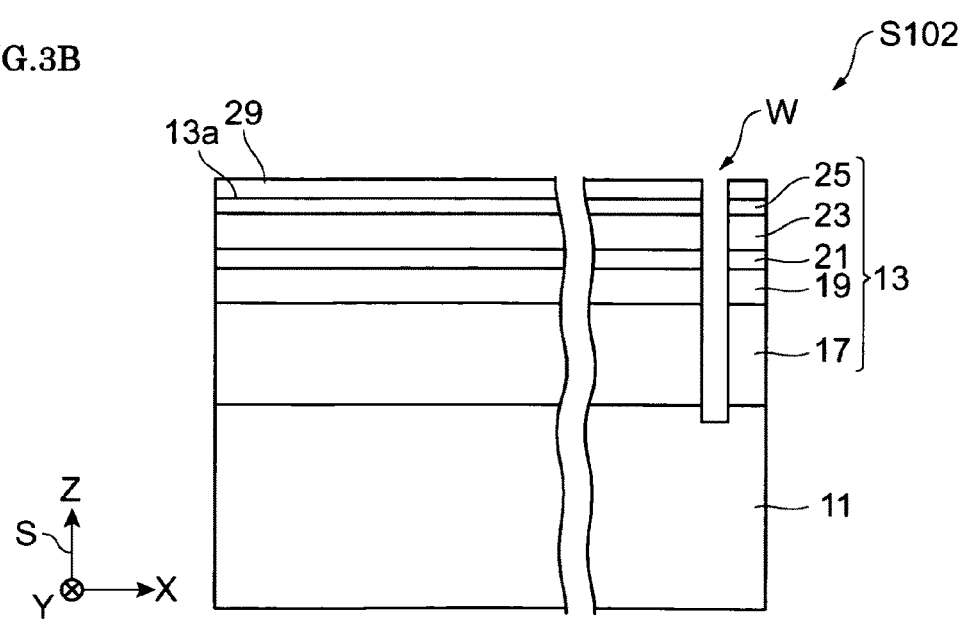

FIGS. 1 and 2 are flow charts illustrating major steps in a method for producing a semiconductor optical device according to the embodiment. The steps shown in FIG. 2 are successively performed after the steps shown in FIG. 1. FIGS. 3A and 3B illustrate major steps in a method for producing a semiconductor optical device according to the embodiment. The step shown in FIG. 3B is performed after the steps shown in FIG. 3A. In the following description, a method for producing a distributed feedback (DFB) laser as a semiconductor optical device will be described. However, the embodiment is not restricted to the case where DFB lasers are produced and is also applicable to the production of semiconductor optical devices including diffraction gratings. These diffraction gratings are formed by a nano-imprint technique as will be understood by the following description. In the method for producing the semiconductor laser, semiconductor layers are grown by, for example, a metal-organic vapor phase epitaxy (MOVPE) method.

In a step of preparing a substrate, a substrate 11 is prepared. The substrate 11 is a semiconductor substrate composed of InP, GaAs, GaN, or the like. The substrate 11 may be an insulator substrate composed of sapphire ($Al_2O_3$) or the like. In step S100, for producing arrays of semiconductor lasers on the substrate 11, a map of periodic structures for forming diffraction gratings to be formed in individual semiconductor lasers is prepared. This map defines the periodic structures to be formed in semiconductor lasers arranged in the device area of a principal surface 11a of the substrate 11.

Referring to FIG. 3A, in step S101, a semiconductor region 13 is formed on the substrate 11. The semiconductor region 13 includes a plurality of III-V group compound semiconductor layers 17, 19, 21, 23, and 25. These semiconductor layers 17, 19, 21, 23, and 25 are formed by, for example, a metal-organic vapor phase epitaxy (MOVPE) method. The semiconductor layers 17, 19, 21, 23, and 25 are stacked on the principal surface 11a of the substrate 11 in the direction along a normal axis Nx, which is normal to the principal surface 11a. Referring to FIG. 3A, a rectangular coordinate system S is illustrated. The Z axis is along the normal axis Nx and the principal surface 11a is, for example, parallel to a plane defined by the X axis and the Y axis. For example, a 2-inch Sn-doped InP substrate can be used as the semiconductor substrate. In this case, the III-V group compound semiconductor layer 17 formed on this semiconductor substrate is an n-type cladding layer (for example, n-type InP, thickness: 550 nm). The III-V group compound semiconductor layer 19 is a first optical waveguide layer (for example, undoped GaInAsP, thickness: 100 nm). The III-V group compound semiconductor layer 21 is an active layer. The III-V group compound semiconductor layer 23 is a second optical waveguide layer (for example, undoped GaInAsP, thickness: 100 nm). The III-V group compound semiconductor layer 25 is a diffraction grating layer (for example, GaInAsP, thickness: 40 nm). In step S101, an epitaxial substrate E1 is formed. The active layer can be constituted by a single semiconductor layer, but preferably has a quantum well structure 27. The quantum well structure 27 includes a stack in which a barrier layer 27a and a well layer 27b are alternately arranged. The barrier layer 27a is composed of, for example, GaInAsP having a bandgap wavelength of 1200 nm and has a thickness of, for example, 10 nm. The well layer 27b is composed of, for example, GaInAsP having a bandgap wavelength of 1550 nm and has a thickness of, for example, 5 nm.

As illustrated in FIG. 3B, in step S102, an alignment mark W is formed in the epitaxial substrate E1. This alignment mark W is, for example, a recess formed in the epitaxial substrate E1. The alignment mark W is formed in, for example, the following manner. An insulator film (for example, thickness: 0.3 μm) composed of, for example, SiN or $SiO_2$ is formed on the epitaxial substrate E1 by chemical vapor deposition (CVD). A resist mask with which the pattern of an alignment mark is to be transferred to the insulator film is formed by photolithography and an etching method. The insulator film is etched by using this resist mask as an etching mask. In etching the insulator film, a reactive ion etching method is used to thereby form a mask 29. This mask 29 has an opening for forming the alignment mark and a principal surface 13a of the semiconductor region 13 is exposed through the opening. $CF_4$ gas is used as an etching gas for etching SiN. To remove the resist, an $O_2$ ashing method is used. The semiconductor region 13 is then etched by a reactive ion etching method through the mask 29 to thereby form the alignment mark in the semiconductor region 13. For example, a $CH_4/H_2$ gas mixture is used as an etching gas for etching the semiconductor region 13. A recess serving as the alignment mark W has a depth of, for example, 1.5 μm. After the etching of the semiconductor region 13, the mask 29 is removed with, for example, hydrofluoric acid.

Figure 4A:
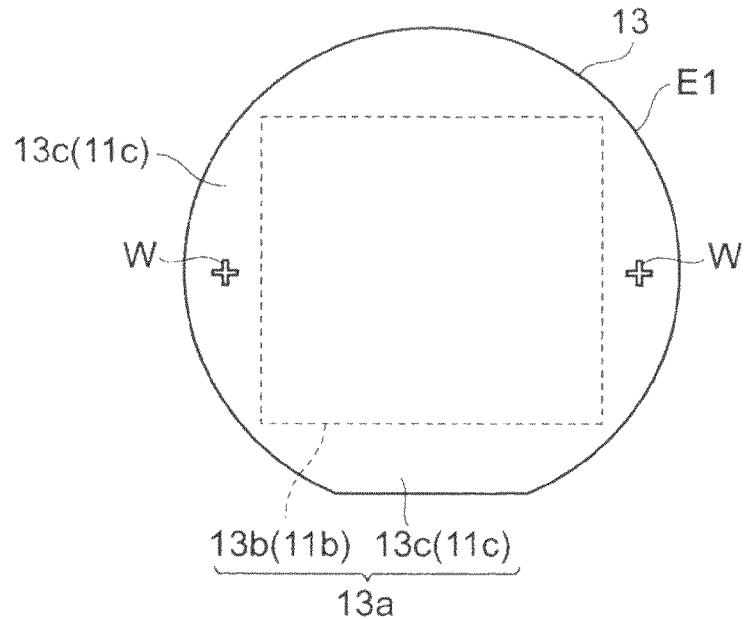
FIGS. 4A and 4B are plan views respectively illustrating an epitaxial substrate and a mask for forming diffraction gratings.
Figure 4B:
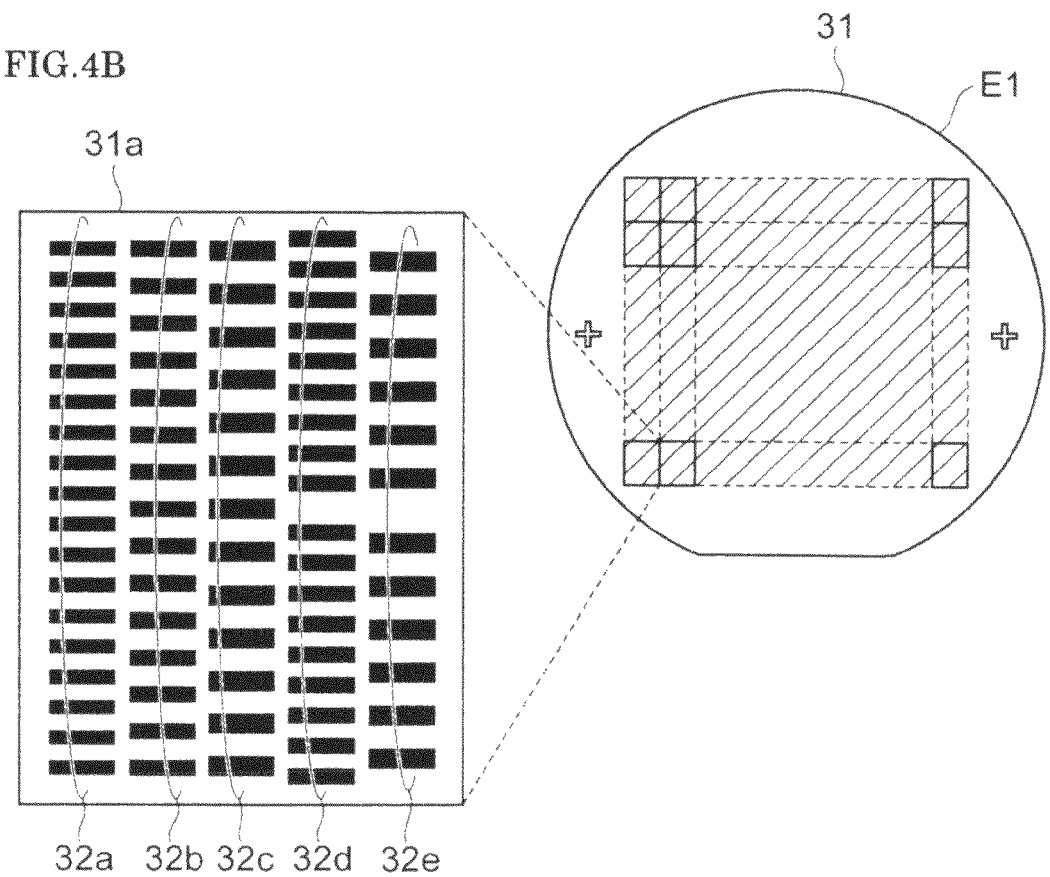

In step S103, a mask 31 for forming diffraction gratings is formed. As illustrated in FIG. 4A, in the epitaxial substrate E1, the semiconductor region 13 includes a first region 13b and a second region 13c. The first region 13b of the semiconductor region 13 is in a first area 11b on the principal surface 11a of the substrate 11. The second region 13c of the semiconductor region 13 is in a second area 11c on the principal surface 11a of the substrate 11. For example, arrays of optical devices are formed in the first area 11b of the substrate 11. Device sections corresponding to the array are defined in the first area 11b. The device sections are arranged in rows and columns. An accessory (for example, an alignment mark) different from such optical devices is formed in the second area 11c of the substrate 11. The alignment mark W is formed in, for example, the second region 13c of the semiconductor region 13. Arrays of optical devices are formed in the first region 13b of the semiconductor region 13. As illustrated in FIG. 4B, the mask 31 is formed on the principal surface 13a of the semiconductor region 13. The mask 31 has patterns 31a. Referring to FIG. 4B, a pattern 31a for forming diffraction gratings in a single device section is illustrated. A single device section is provided for forming a single optical device. Arrays of the patterns 31a are formed in the first region 13b of the semiconductor region 13. Each pattern 31a includes a plurality of pattern portions 32a, 32b, 32c, 32d, and 32e for forming diffraction gratings. The pattern portions 32a to 32e extend in an identical direction. An example of the diffraction grating pattern portions 32a to 32e is as follows. The pattern portion 32a has a diffraction grating pattern in which a grating period is 202.4 nm and a λ/4-phase-shift region is not included. The pattern portion 32b has a diffraction grating pattern in which a grating period is 232.1 nm and a λ/4-phase-shift region is not included. The pattern portion 32c has a diffraction grating pattern in which a grating period is 241.7 nm and a λ/4-phase-shift region is not included. The pattern portion 32d has a diffraction grating pattern in which a grating period is 202.4 nm and a λ/4-phase-shift region is included. At the λ/4-phase-shift region, a grating period is shifted toward longer or shorter by the half length of a period. The pattern portion 32e has a diffraction grating pattern in which a grating period is 241.7 nm and a λ/4-phase-shift region is included. For example, the pattern 31a can include pattern portions having different duty ratios; the pattern 31a can include pattern portions having different periods; and the pattern 31a can include pattern portions that are different with regard to the presence or absence of a phase-shift region.

Figure 5:
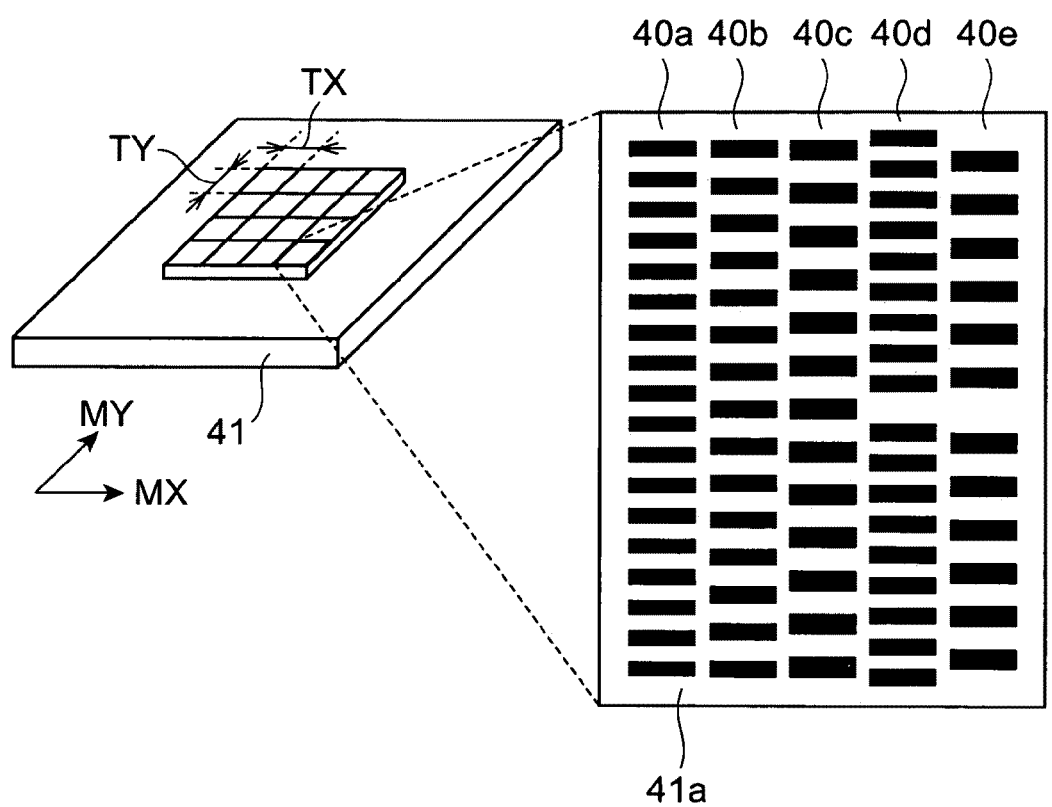
FIG. 5 illustrates a mold used in a method for producing a semiconductor optical device according to the embodiment.

The mask 31 is formed by a nano-imprint technique. The following steps are performed for employing the nano-imprint technique. In step S104, a mold 41 illustrated in FIG. 5 is prepared. The mold 41 has a pattern surface 41a. Patterns 40 are disposed on the pattern surface 41a. For example, the patterns 40 are arranged in arrays on the pattern surface 41a. Each pattern 40 includes a plurality of pattern portions 40a to 40e. For example, the pattern portions 40a are periodically arranged in the direction of an MX axis with a period of a length TX corresponding to the length of one side of a semiconductor optical device. The pattern portions 40a are also periodically arranged in the direction of an MY axis, which is orthogonal to the direction of the MX axis, with a period of a length TY corresponding to the length of another side of the semiconductor optical device. In this case, the size of a region corresponding to a single chip of a semiconductor optical device is TX×TY. The pattern portions 40a to 40e define a plurality of periodic structures 42a to 42e (refer to FIG. 8) for forming diffraction gratings.

Figure 6A:
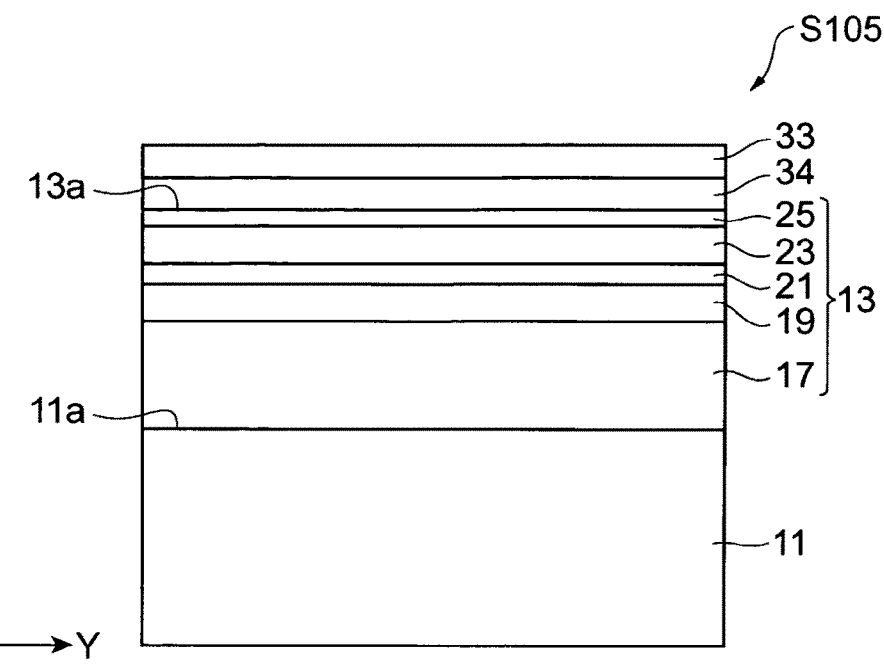
FIGS. 6A and 6B are schematic views illustrating major steps in a method for producing a semiconductor optical device according to the embodiment, the step shown in FIG. 6B being performed after the step shown in FIG. 6A.

Next, as illustrated in FIG. 6A, in step S105, a hard mask film 34 is formed on the principal surface 13a of the semiconductor region 13 in advance. A resin 33 is coated on the hard mask film 34 to thereby form a resin layer for nano-imprinting. The hard mask film 34 is composed of, for example, SiON or the like. The resin 33 for nano-imprinting is, for example, an ultraviolet (UV) curable resin or the like.

Figure 6B:
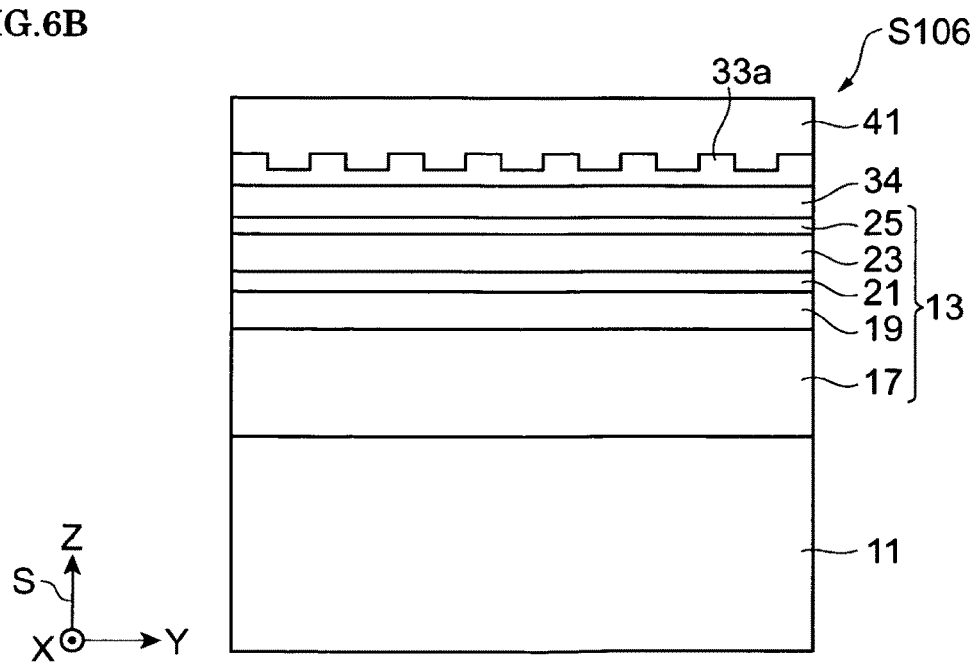

As illustrated in FIG. 6B, in step S106, the thus-formed resin is pressed with the mold 41 and irradiated with ultraviolet rays to thereby cure the resin and transfer the pattern of the mold 41 to the resin layer 33a. Next, the mold 41 is detached from the resin. If necessary, a repeating step in which moving of the mold 41 at a certain pitch and pressing of the mold 41 on a coated resin are alternately performed can be conducted. As illustrated in FIG. 7A, in step S107, the mask 31, which is the resin layer 33a transferred the pattern as shown in FIG. 6B, is formed on the hard mask film 34 which is formed on the principal surface 13a of the semiconductor region 13. The mask 31 includes the pattern transferred from the mold (for example, pattern portions 32a to 32e). The transferred pattern of the mask 31 have the same pattern of the pattern 40 formed on the pattern surface 41a of the mold 41. By conducting the patterning by a nano-imprint technique, throughput can be considerably improved.

As illustrated in FIG. 7B, the hard mask film 34 is etched by using the mask 31 as an etching mask to thereby transfer the pattern formed in the mask 31 to the hard mask film 34. Such etching is conducted by, for example, reactive ion etching. In the etching, $CF_4$ gas can be used as an etching gas. During the etching, the mask 31 is also etched and the thickness of the mask 31 is reduced. When the etching is complete, the mask 31 becomes a mask 31c having a smaller thickness than the initial thickness. The mask 31c made of resin is removed and a hard mask 34a is provided. After the mask 31c is removed, as illustrated in FIG. 7C, in step S108, the III-V group compound semiconductor layer 25 is etched by using the hard mask 34a as an etching mask to thereby form a diffraction grating layer 25a. The diffraction grating layer 25a has periodic structures for diffraction gratings which include periodic projections and recesses. Such etching is conducted by, for example, reactive ion etching. In the etching, $CF_4$ gas can be used as an etching gas. After the diffraction grating layer 25a is formed, the hard mask 34a is removed to thereby form a substrate product P1. The hard mask 34a is removed with buffered hydrofluoric acid. In this embodiment, a method for forming the diffraction grating layer 25a employs two steps: the mask 31 composed of a resin layer 33a is formed by a nano-imprint technique and a pattern is subsequently transferred with the mask 31 to thereby form the hard mask 34a. Alternatively, the diffraction grating layer 25a may be formed by directly etching the III-V group compound semiconductor layer 25 by using the mask 31 composed of a resin layer 33a as an etching mask.

Figure 8:
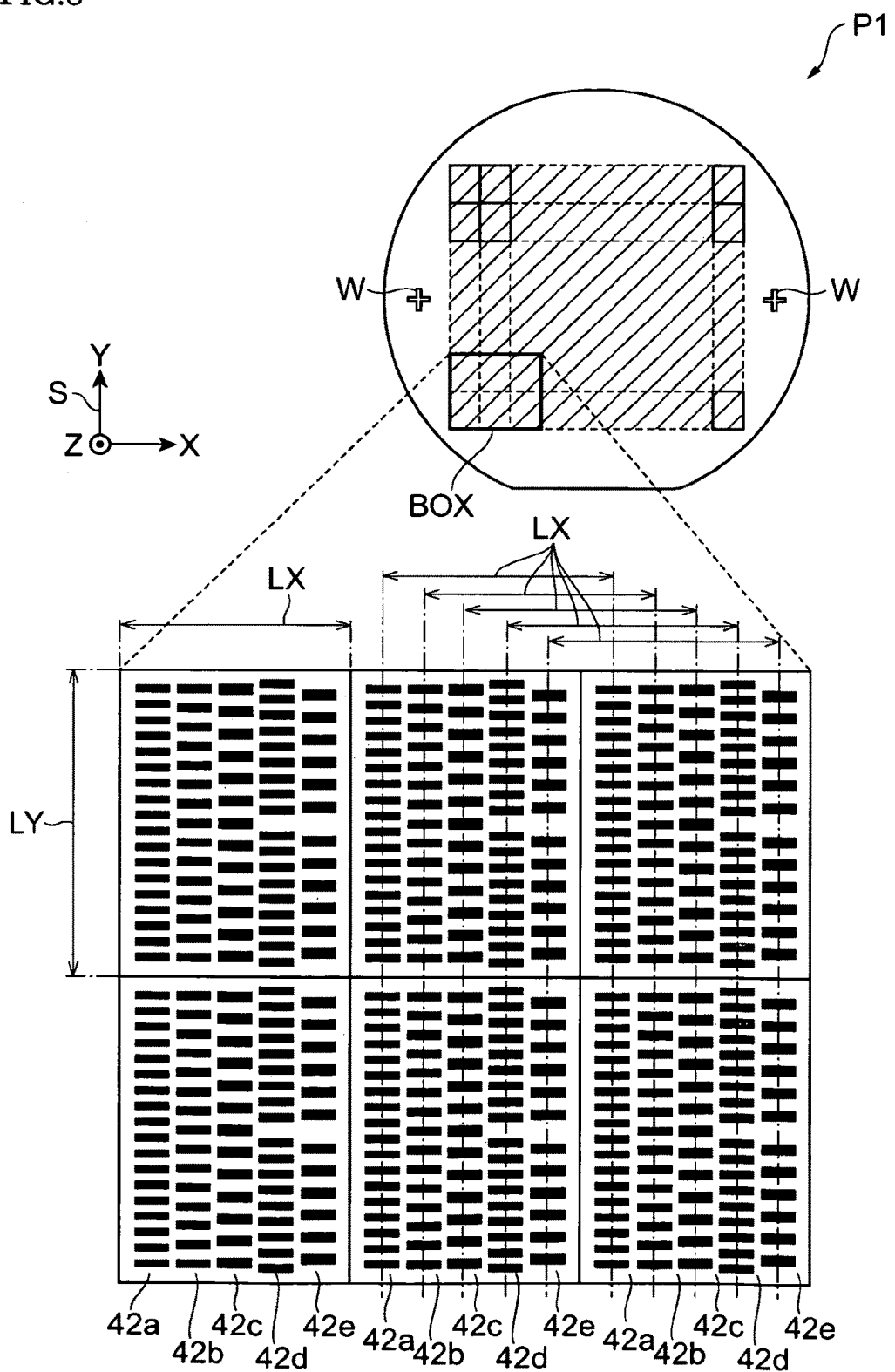
FIG. 8 is a plan view illustrating a substrate product obtained in a step of forming a diffraction grating layer.

FIG. 8 illustrates the top surface of a substrate product obtained in the step of forming the diffraction grating layer 25a. This substrate product P1 includes the semiconductor region 13. The diffraction grating layer 25a is provided as the uppermost layer of the semiconductor region 13. Referring to FIG. 8, a device area (the enlarged view of an area BOX defined by the solid lines illustrates device sections in which six semiconductor optical devices are to be formed) and an accessory area including the alignment marks W are illustrated. In this embodiment, the enlarged view of the device sections illustrates the arrangement of three sections in the X axis direction and two sections in the Y axis direction.

In the device area, periodic structures 42a, 42b, 42c, 42d, and 42e for forming a plurality of diffraction gratings are formed in each section corresponding to a single optical device. The periodic structures 42a to 42e are respectively formed by transferring the pattern of the pattern portions 32a to 32e. The periodic structures 42a to 42e each extend in an identical direction (direction of the Y axis). An example of the periodic structures 42a to 42e according to the pattern portions 32a to 32e is as follows. The periodic structure 42a has a diffraction grating pattern in which a grating period is 202.4 nm and a λ/4-phase-shift region is not included. The periodic structure 42b has a diffraction grating pattern in which a grating period is 232.1 nm and a λ/4-phase-shift region is not included. The periodic structure 42c has a diffraction grating pattern in which a grating period of 241.7 nm and a λ/4-phase-shift region is not included. The periodic structure 42d has a diffraction grating pattern in which a grating period is 202.4 nm and a λ/4-phase-shift region is included. The periodic structure 42e has a diffraction grating pattern in which a grating period is 241.7 nm and a λ/4-phase-shift region is included. In neighboring two device sections, the distance between the same periodic structures (for example, the distance between the two periodic structures 42a in neighboring two device sections) is equal to a length LX of a device in the X axis direction. The periodic structures are periodically arranged in the X axis direction and the Y axis direction.

Figure 9A:
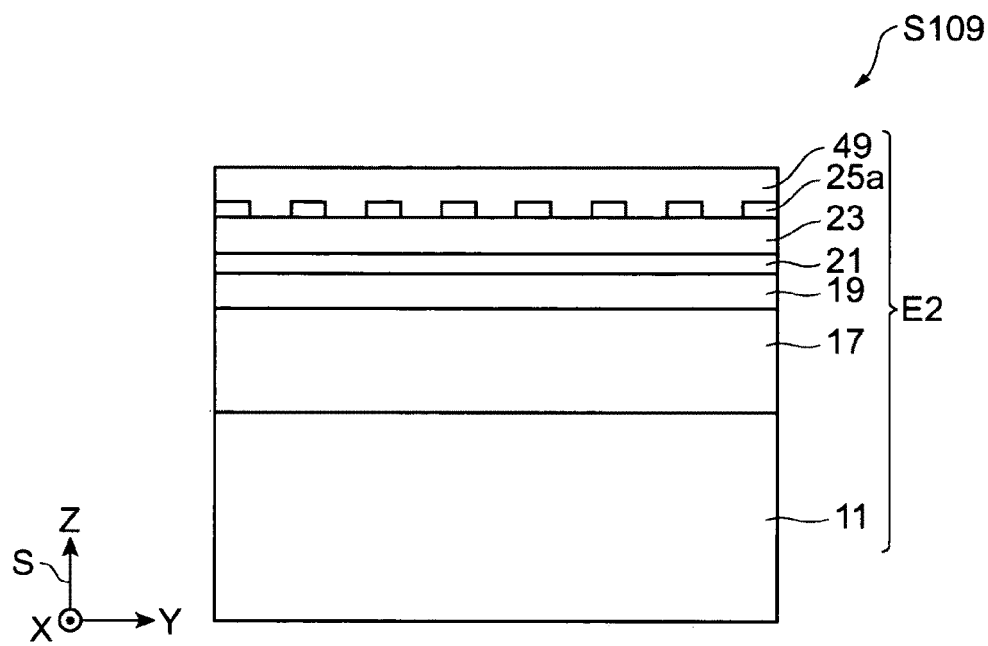
FIGS. 9A and 9B are schematic views illustrating major steps in a method for producing a semiconductor optical device according to the embodiment, the step shown in FIG. 9A being performed after the step shown in FIG. 7C.

Steps for producing a semiconductor laser will be continuously described. As illustrated in FIG. 9A, in step S109, a semiconductor region 49 is grown on the diffraction grating layer 25a. The semiconductor region 49 includes, for example, a p-type InP cladding layer and a p-type InGaAs cap layer. In step S109, the diffraction grating layer 25a is covered with the semiconductor region 49 to thereby produce an epitaxial substrate E2.

Figure 9B:
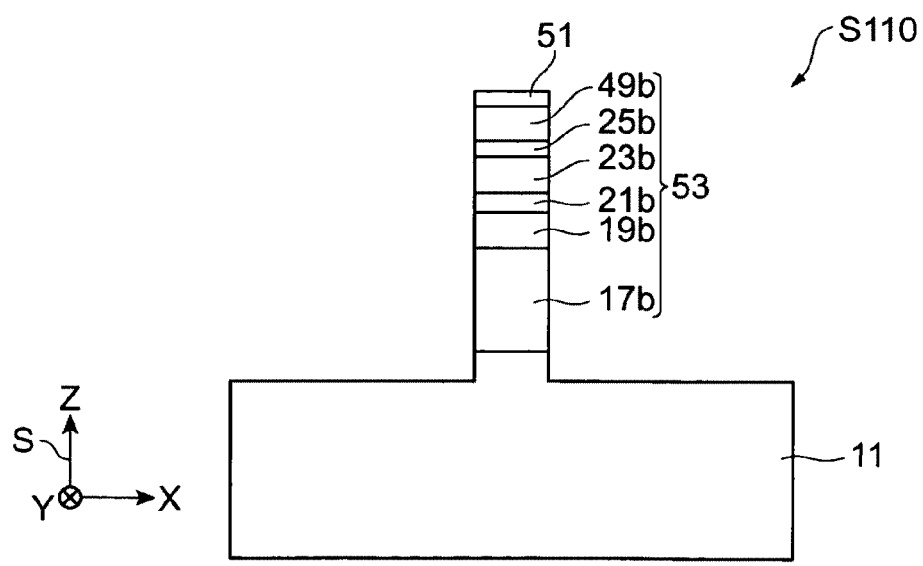
Figure 10A:
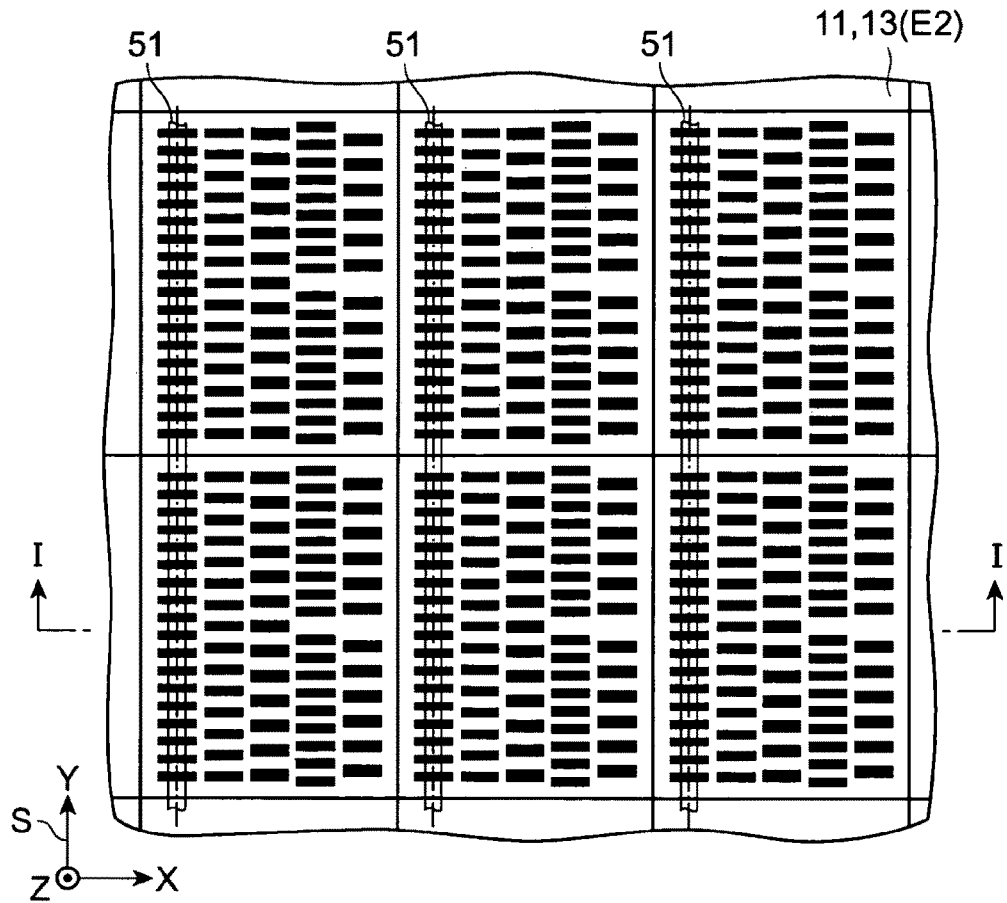
FIGS. 10A and 10B illustrate a portion of the top surface of a substrate product and are respectively a plan view and a sectional view of selected periodic structures.
Figure 10B:
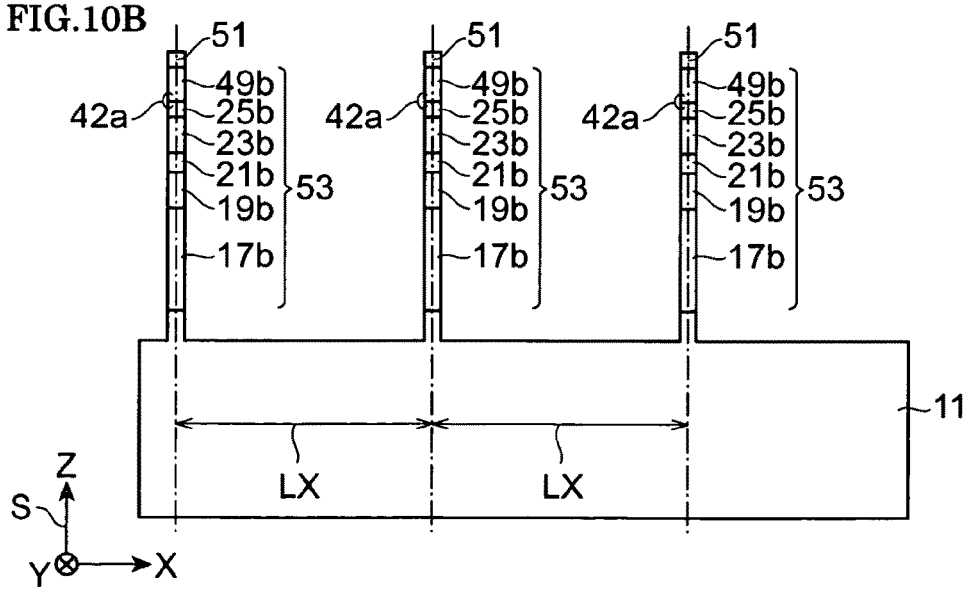

As illustrated in FIG. 9B, in step S110, stripe mesas are formed. Specifically, in the epitaxial substrate E2, a periodic structure that can provide desired laser characteristics is selected for each device section in accordance with the map defined in step S100 among the periodic structures 42a to 42e for forming diffraction gratings. In this embodiment, the periodic structures 42a are selected among the periodic structures 42a to 42e and, as illustrated in FIG. 10A, stripe mesas including the periodic structures 42a are formed in a later process. A mask for forming such stripe mesas is aligned so as to cover periodic structures that provide desired laser characteristics. When stripe mesas formed on a substrate include periodic structures (for example, 42a) having an identical pattern among the periodic structures 42a to 42e, as illustrated in FIG. 10B, the stripe mesas are periodically arranged. Thus, the device size of laser devices is not changed.

Referring to FIG. 9B, an example of the formation of stripe mesas will be described. A mask 51 that defines the orientation and the width of stripe mesas is formed. The mask 51 is formed by, for example, photolithography and etching. The mask 51 is aligned so as to be on the desired periodic structures with reference to the alignment marks having been formed in an earlier step. The mask 51 is constituted by, for example, an insulator film. The insulator film is made of, for example, SiN or $SiO_2$. The mask 51 has a thickness of, for example, 0.5 μm. A resist mask with a predetermined stripe pattern for forming stripe mesas is formed on the insulator film by photolithography. The insulator film is subsequently etched by using the patterned resist mask. When the insulator film is made of SiN, a reactive ion etching method with $CF_4$ gas is used for etching the insulator film, to thereby transfer the pattern for forming stripe mesas in the patterned resist mask to the insulator film. After etching the insulator film, the patterned resist mask is removed by $O_2$ plasma ashing. Thus, the mask 51 for forming stripe mesas is formed. The epitaxial substrate E2 is etched by using the mask 51 as an etching mask. Then, the stripe mesas 53 are formed. The stripe mesas 53 include the semiconductor layers 17b, 19b, 21b, 23b, 25b, and 49b. Such etching may be performed by dry etching or wet etching. For example, when wet etching is employed, the semiconductors are etched with a bromine methanol (Br:$CH_3OH$) solution as an etchant. The etching is stopped when the width of the active layer is decreased to 1.2 μm by side etching. The stripe mesas have a height of, for example, about 2.0 μm.

FIGS. 10A and 10B illustrate an example of the arrangement of stripe mesas. Referring to FIG. 10A, illustrated is an enlarged view of the principal surface of a substrate product provided in the step of forming stripe mesas. Referring to FIG. 10B, illustrated is a section taken along section line I-I of FIG. 10A. FIGS. 10A and 10B illustrate the arrangement of the stripe mesas 53 including the periodic structures 42a for the diffraction grating. Semiconductor lasers including the stripe mesas illustrated in FIG. 10A include, for example, the periodic structures 42a that do not include a λ/4-phase-shift region and have a period of 202.4 nm.

The stripe mesas 53 extend in the direction of the Y axis. To avoid the presence of a plurality of the stripe mesas 53 in a single device section, the stripe mesas 53 preferably continuously extend from one side to the opposite side of the first area 11b of the substrate 11. If the stripe mesas 53 do not continuously extend, the presence of a plurality of the stripe mesas 53 in a single device section can occur at the positions where the stripe mesas 53 do not continuously extend.

Figure 11A:
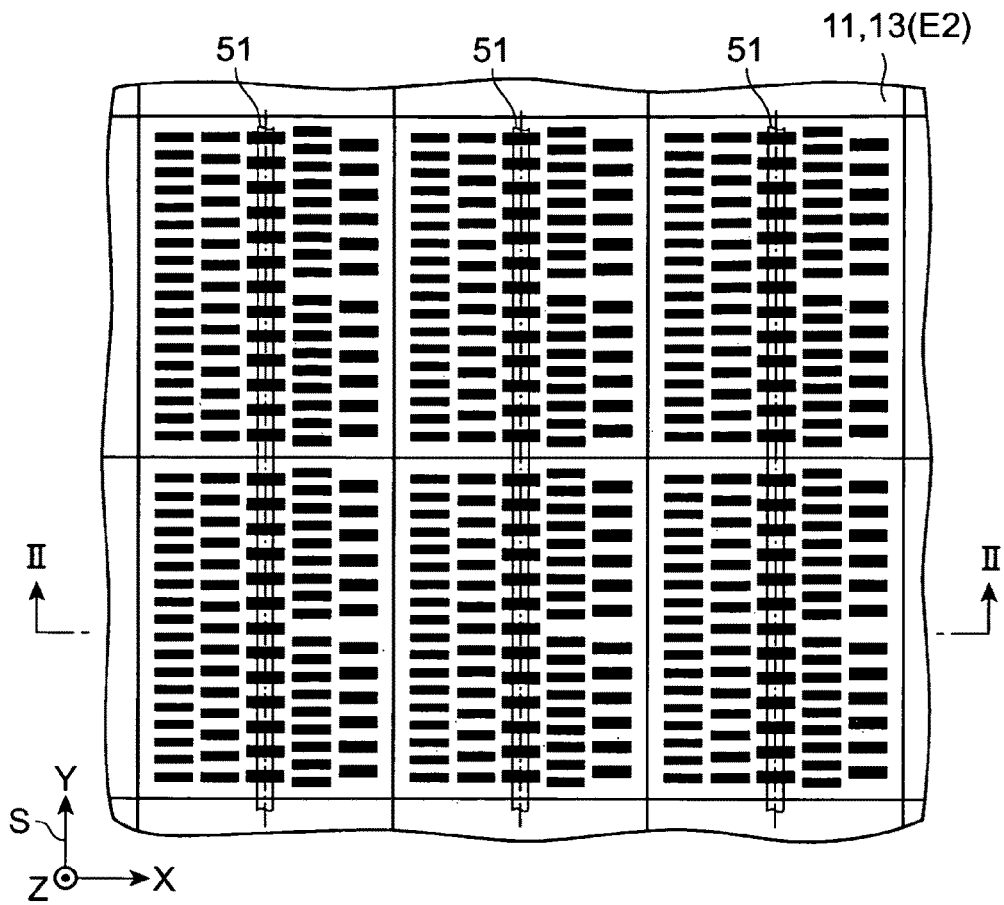
FIGS. 11A and 11B illustrate a portion of the top surface of a substrate product and are respectively a plan view and a sectional view of selected periodic structures.
Figure 11B:
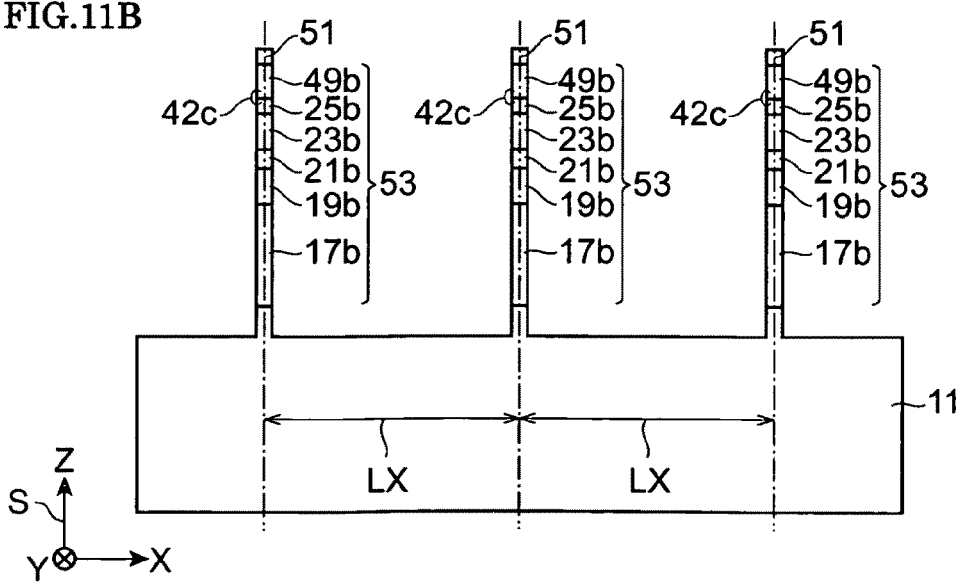

FIGS. 11A and 11B illustrate another example of the arrangement of stripe mesas. Referring to FIG. 11A, illustrated is an enlarged view of the principal surface of a substrate product provided in the step of forming stripe mesas. Referring to FIG. 11B, illustrated is a section taken along section line II-II of FIG. 11A. FIGS. 11A and 11B illustrate the arrangement of the stripe mesas 53 including the periodic structures 42c for the diffraction grating. Semiconductor lasers including the stripe mesas illustrated in FIG. 11A include, for example, the periodic structures 42c that do not include a λ/4-phase-shift region and have a period of 241.7 nm. The stripe mesas illustrated in FIG. 11A also preferably continuously extend from one side to the opposite side of the first area 11b of the substrate 11.

Figure 12A:
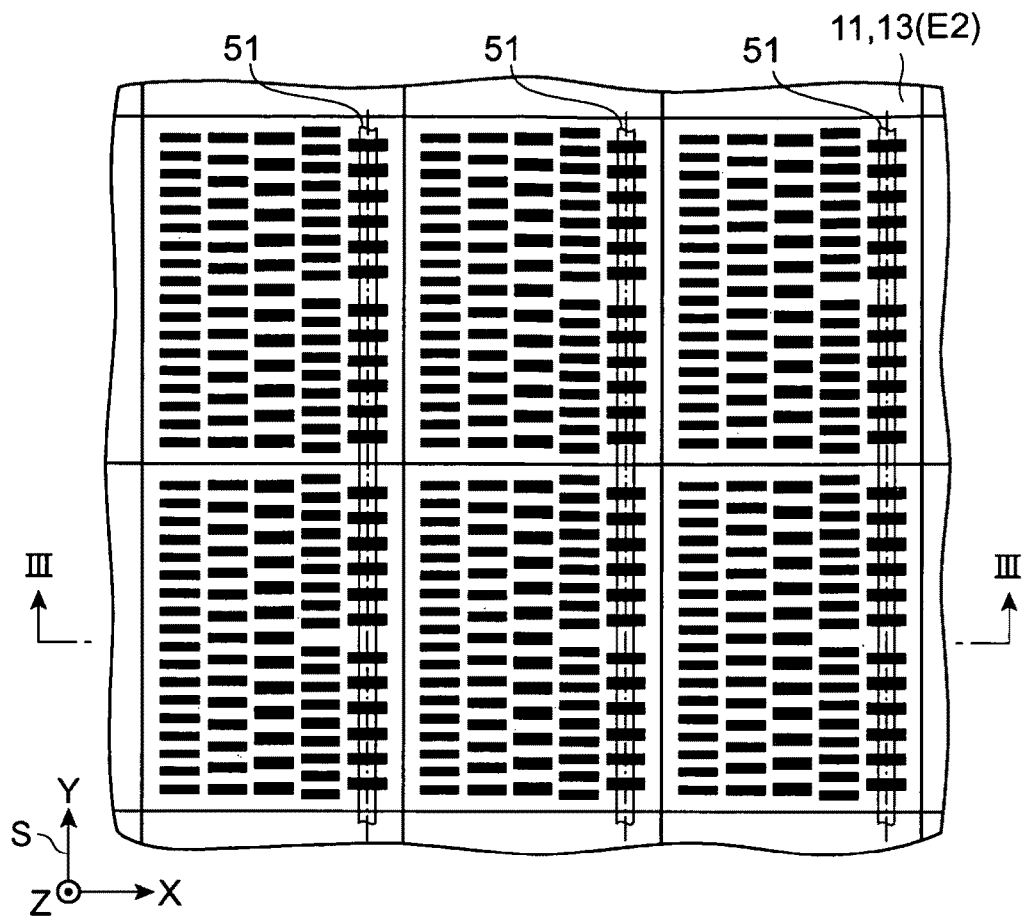
FIGS. 12A and 12B illustrate a portion of the top surface of a substrate product and are respectively a plan view and a sectional view of selected periodic structures.
Figure 12B:
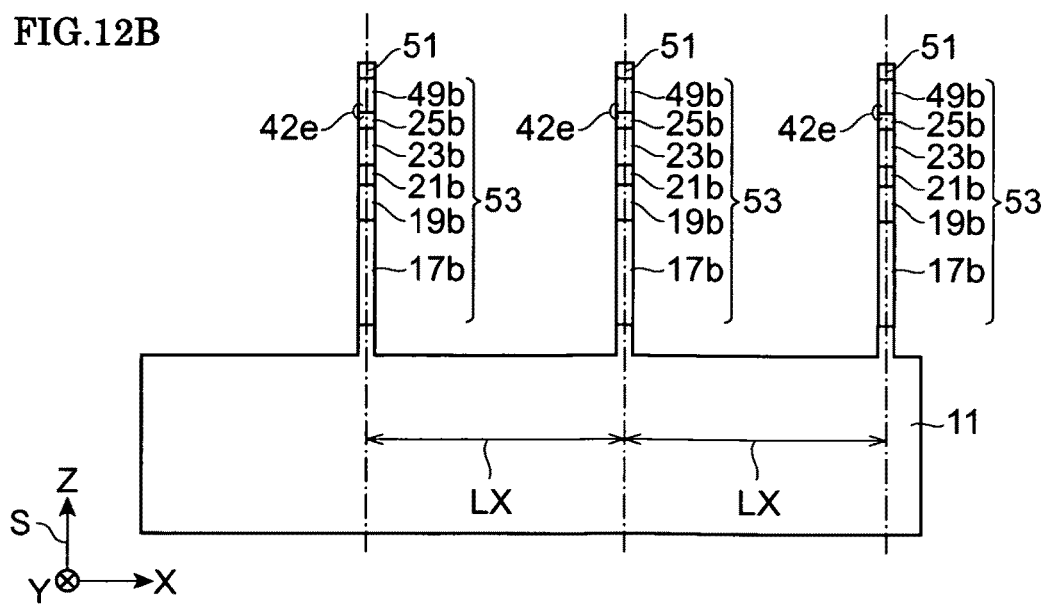

FIGS. 12A and 12B illustrate still another example of the arrangement of stripe mesas. Referring to FIG. 12A, illustrated is an enlarged view of the principal surface of a substrate product provided in the step of forming stripe mesas. Referring to FIG. 12B, illustrated is a section taken along section line III-III of FIG. 12A. FIGS. 12A and 12B illustrate the arrangement of the stripe mesas 53 including the periodic structures 42e for the diffraction grating. Semiconductor lasers including the stripe mesas illustrated in FIG. 12A include, for example, the periodic structures 42e that include a λ/4-phase-shift region and have a period of 241.7 nm. The stripe mesas illustrated in FIG. 12A also preferably continuously extend from one side to the opposite side of the first area 11b of the substrate 11. The areas of the stripe mesas 53 illustrated in FIGS. 10A to 12B can be formed in part of or in the entirety of the first area 11b in the principal surface 11a of a single substrate 11. The same semiconductor lasers can be formed on a single substrate 11 in accordance with a map by selecting a single periodic structure for the entirety of the first area 11b on the principal surface 11a of the single substrate 11. Alternatively, the same semiconductor lasers can also be formed on another single substrate 11 in accordance with another map by selecting another single periodic structure for the entirety of the first area 11b on the principal surface 11a of the single substrate 11. Alternatively, semiconductor lasers of a plurality of types can also be formed on another single substrate 11 in accordance with still another map by dividing the first area 11b on the principal surface 11a of the single substrate 11 into a plurality of sections and selecting a different periodic structure for each section.

Figure 13A:
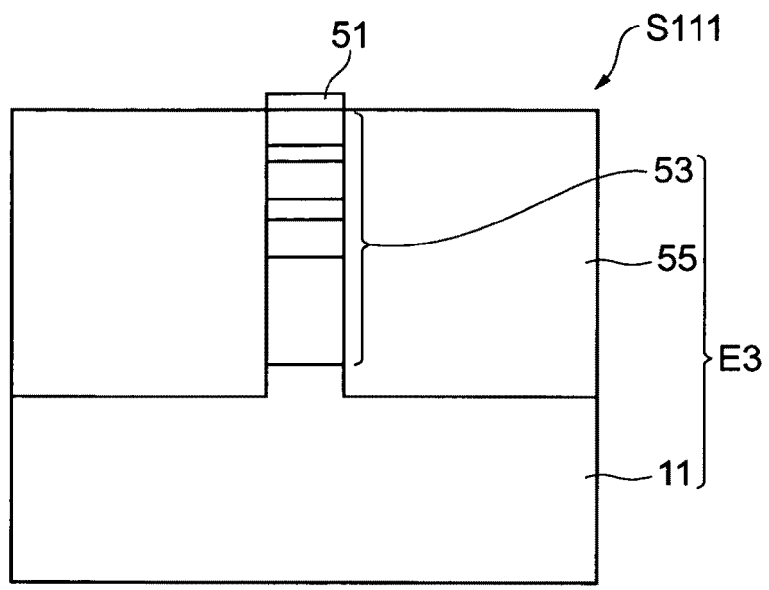
FIGS. 13A and 13B are schematic views illustrating major steps in a method for producing a semiconductor optical device according to the embodiment, the step shown in FIG. 13A being performed after the step shown in FIG. 9B.

As illustrated in FIG. 13A, in step S111, a buried layer 55 is grown on the side of the stripe mesas 53 by using the mask 51 as a selective growth mask. For example, the buried layer 55 can have a buried structure having pn-current blocking layers or having a high resistive current blocking layer made of, for example, Fe-doped InP. When such a buried structure having pn-current blocking layers is employed, a p-type InP layer having a thickness of 1 µm is grown, an n-type InP layer having a thickness of 1 µm is subsequently grown, and a p-type InP layer having a thickness of 0.2 µm is further grown. After growing the buried layer 55, the mask 51 is removed. When the mask 51 is made of SiN, the mask 51 is removed by using, for example, hydrofluoric acid as an etchant. In step S111, an epitaxial substrate E3 including the stripe mesas 53 and the buried layer 55 is produced.

If necessary, after the mask 51 is removed, the cap layers serving as the uppermost layers of the stripe mesas 53 may be removed and semiconductor mesas can be formed. When the cap layers are composed of InGaAs, the cap layers can be removed by selective etching with a mixed solution of phosphoric acid and aqueous hydrogen peroxide. A semiconductor region is grown on the resultant mesas 53 and the buried layer 55. This semiconductor region includes, for example, a p-type InP cladding layer and a p-type InGaAs contact layer.

If necessary, in step S112, a trench is formed in the buried layer 55. The trench is formed by etching. In step S113, the trench is buried by coating a benzocyclobutene (BCB) resin. After the BCB resin is coated, for example, the top surfaces of the stripe mesas 53 are exposed by etching.

Figure 13B:
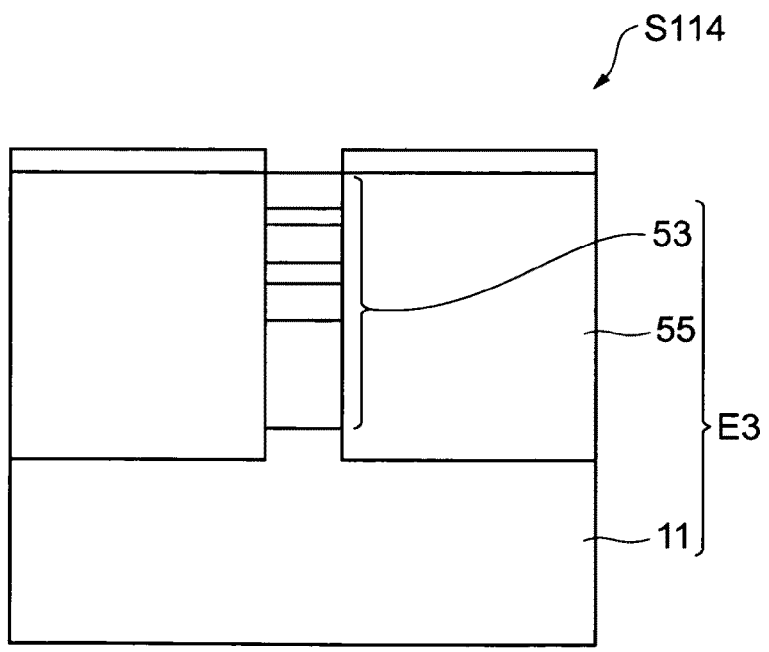
Figure 14:
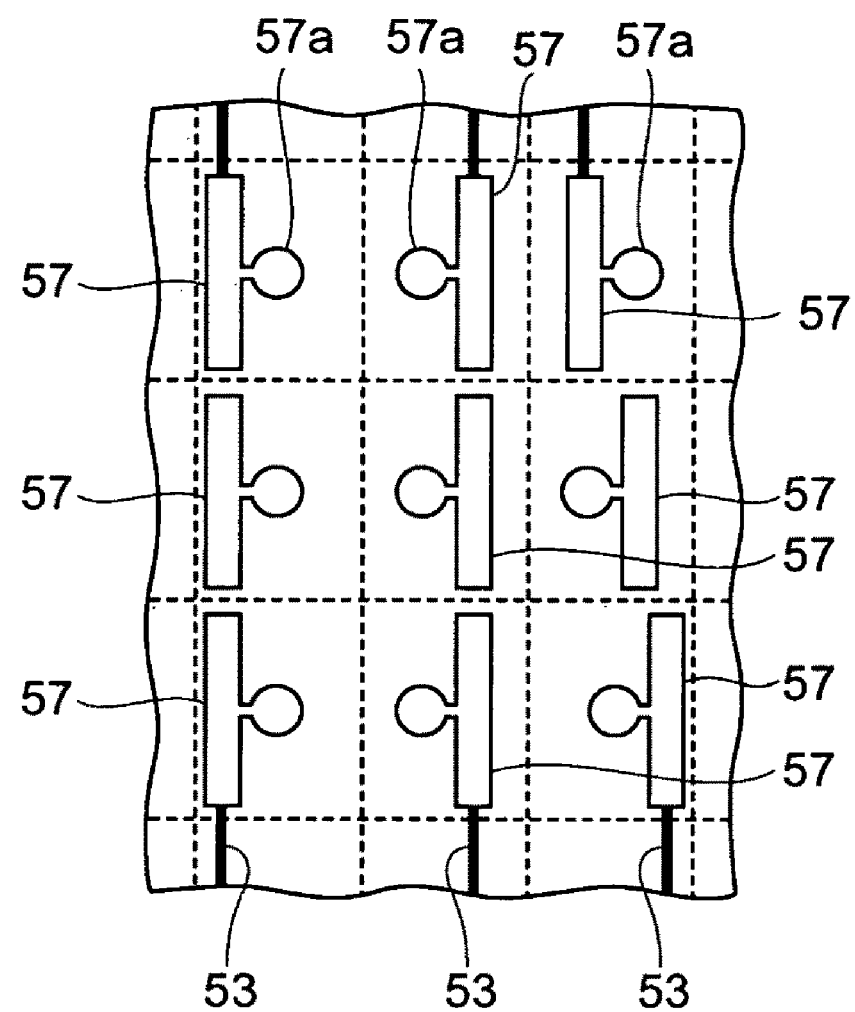
FIG. 14 illustrates the arrangement of electrodes of semiconductor lasers produced by a method for producing a semiconductor optical device according to the embodiment.

FIG. 14 illustrates an example of the arrangement of electrodes on a substrate product for semiconductor lasers. In the step of forming electrodes, electrodes 57 are formed on the epitaxial substrate E3. Specifically, as illustrated in FIG. 13B, in step S114, an insulator film having openings for forming the electrodes is formed. These openings are positioned above desired stripe mesas including diffraction grating structures. In step S115, an ohmic metal of Ti/Pt/Au is deposited over the openings for forming the electrodes and the insulator film. By performing a liftoff process, electrodes 57 (for example, anodes) having a predetermined pattern are formed. The electrodes 57 include pad electrodes 57a. In step S116, the back surface of the semiconductor substrate 11 is polished so that the thickness of the substrate 11 is decreased to about 100 µm. In step S117, AuGe ohmic metal (for example, cathode) is deposited onto the polished surface. Thus, the final substrate product is provided.

In step S118, this substrate product is divided into laser bars by, for example, cleaving. Each laser bar is divided into a large number of semiconductor laser chips. To form semiconductor lasers having an identical periodic structure in a laser bar, a map can be defined with which the identical periodic structure (for example, the periodic structure 42a) is formed in device sections arranged in a row in a direction (for example, the X axis direction) intersecting with a direction (for example, the Y axis direction) in which stripe mesas extend. This map can also be defined such that another identical periodic structure (for example, the periodic structure 42c) is formed in device sections arranged in another row. Even when a plurality of periodic structures constituting diffraction gratings are selected, each selected periodic structure is within the width of a single device. Accordingly, by adjusting the position and the orientation of the pad electrodes 57a in accordance with the positions of stripe mesas such that each electrode 57 is within a single chip for division of the substrate product into laser bars, semiconductor lasers of a plurality of types can be produced with a single mold 41.

In step S119, a coating film is formed on a cleaved end facet of the laser bar. In step S120, semiconductor laser chips are produced from laser bars in consideration of the arrangement of the electrodes 57 having been aligned as described above. As a result of these steps, semiconductor lasers can be produced.

Figure 15A:
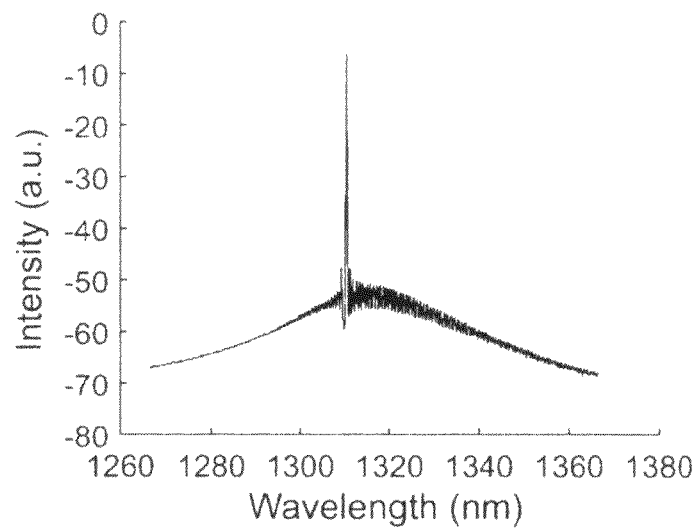
FIGS. 15A to 15C illustrate lasing spectra of semiconductor lasers produced by a method for producing a semiconductor optical device according to the embodiment.
Figure 15B:
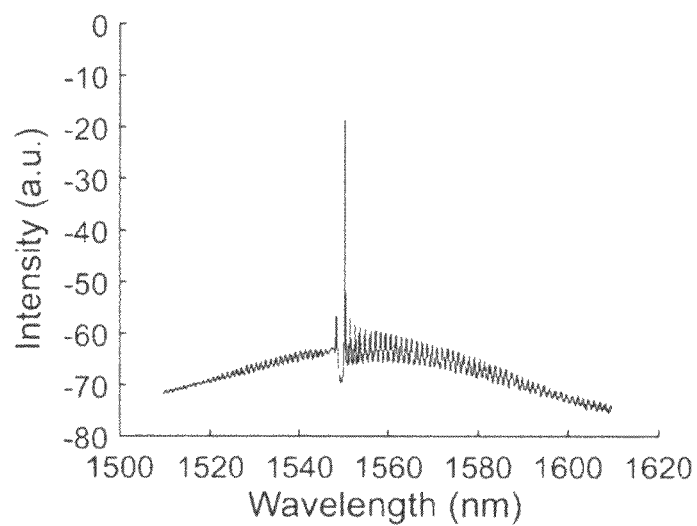
Figure 15C:
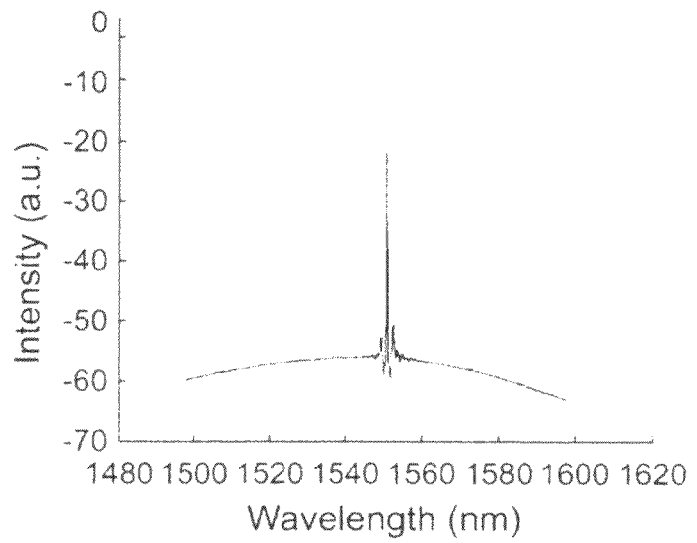

FIGS. 15A, 15B, and 15C illustrate lasing spectra of semiconductor lasers produced from different substrates by using the method as described above. In producing these semiconductor lasers, an identical mold is used for forming the patterns of the periodic structures. FIG. 15A illustrates a lasing spectrum of a semiconductor laser including an active layer formed for the 1.31 µm band and a diffraction grating having a period of 202.4 nm, the diffraction grating not including a phase-shift structure. FIG. 15B illustrates a lasing spectrum of a semiconductor laser including an active layer formed for the 1.55 µm band and a diffraction grating having a period of 232.1 nm, the diffraction grating not including a phase-shift structure. FIG. 15C illustrates a lasing spectrum of a semiconductor laser including an active layer formed for the 1.55 µm band and a diffraction grating having a period of 232.1 nm, the diffraction grating including a phase-shift structure. All the lasing spectra have good shapes.

Principles of the present invention have been described on the basis of preferred embodiments with reference to the drawings. However, those skilled in the art will understand that the present invention can be changed in terms of arrangements and detailed portions without departing from the principles. The present invention is not restricted to the specific configurations disclosed in the embodiments. Therefore, all the modifications and changes within the scope and the spirit of Claims are claimed as the present invention.

What is claimed is:

1. A method for producing a semiconductor optical device, comprising the steps of:
    forming a semiconductor region including a semiconductor layer on a substrate, the substrate including a principal surface, the principal surface including a device area including device sections arranged in rows and columns;
    preparing a mold including a pattern surface, the pattern surface including an arrangement of patterns each including first to n-th pattern portions;
    forming a first mask on the semiconductor region with the mold by a nano-imprint technique;
    forming first to n-th periodic structures in each of the device sections in the semiconductor region by using the first mask, the first to n-th periodic structures respectively corresponding to the first to n-th pattern portions;
    forming a second mask after the first mask is removed, the second mask including a first pattern on an i-th periodic structure ($1 \leq i \leq n$) among the first to n-th periodic structures in a first section of the device sections and including a second pattern on a j-th periodic structure ($1 \leq j \leq n$) among the first to n-th periodic structures in a second section of the device sections; and
    forming first and second stripe mesas in the first and second sections respectively by using the second mask, wherein
    the first to n-th periodic structures are arranged adjacent to one another in a direction of the rows;
    the first to n-th periodic structures each extend in a direction of the columns;
    the second mask includes openings above periodic structures other than the i-th periodic structure in the first section of the device sections and above periodic structures other than the j-th periodic structure in the second section of the device sections;

the periodic structures other than the i-th periodic structure in the first section are removed upon formation of the first and second stripe mesas; and the periodic structures other than the j-th periodic structure in the second section are removed upon the formation of the first and second strip mesas.

2. The method according to claim 1, wherein at least one pattern portion among the first to n-th pattern portions of the mold is different from another pattern portion among the first to n-th pattern portions.

3. The method according to claim 1, wherein at least one periodic structure among the first to n-th periodic structures is different from another periodic structure among the first to n-th periodic structures.

4. The method according to claim 1, wherein the first to n-th periodic structures include projections and recesses periodically arranged so as to form diffraction gratings.

5. The method according to claim 1, further comprising a step of growing a buried layer for burying the first and second stripe mesas.

6. The method according to claim 1, further comprising a step of forming an alignment mark in the semiconductor region in an accessory area in the principal surface,
wherein
the mold is aligned with reference to the alignment mark in the step of forming the first mask; and
the second mask is formed with reference to the alignment mark.

7. The method according to claim 1, wherein the semiconductor region includes a first optical waveguide layer, an active layer, a second optical waveguide layer, and a diffraction grating layer.

8. The method according to claim 7, wherein
the first and second stripe mesas include the first optical waveguide layer, the active layer, the second optical waveguide layer, and the diffraction grating layer; and
the periodic structures include projections and recesses periodically arranged so as to form diffraction gratings and the periodic structures are formed in the diffraction grating layer.

9. The method according to claim 1, wherein
the first to n-th periodic structures include projections and recesses periodically arranged so as to form diffraction gratings; and
a k-th pattern portion among the first to n-th pattern portions of the mold is different from an m-th pattern portion (k is not equal to m) among the first to n-th pattern portions in terms of at least one property among period and a presence or absence of a phase-shift region.

10. The method according to claim 1, wherein
the first to n-th periodic structures include projections and recesses periodically arranged so as to form diffraction gratings; and
the first to n-th periodic structures have different structures from one another in terms of at least one property among period, a duty ratio, and a presence or absence of a phase-shift region.

11. The method according to claim 1, wherein the first pattern of the second mask is formed on the i-th periodic structure ($1 \leq i \leq n$) among the first to n-th periodic structures in the first section of the device sections and the second pattern of the second mask is formed on the j-th periodic structure ($1 \leq j \leq n$, i is different from j) among the first to n-th periodic structures in the second section of the device sections.

12. The method according to claim 1, further comprising:
a step of forming an insulator layer over the first and second stripe mesas, the insulator layer including openings positioned above the first and second stripe mesas; and
a step of, after the formation of the insulator layer over the first and second stripe mesas, forming first and second electrodes on the one or more semiconductor layers in accordance with positions of the i-th and j-th periodic structures.

13. The method according to claim 1, wherein
the first pattern of the second mask is formed on the i-th periodic structure ($1 \leq i \leq n$) among the first to n-th periodic structures in the first section of the device sections;
the second pattern of the second mask is formed on the j-th periodic structure ($1 \leq j \leq n$) among the first to n-th periodic structures in the second section of the device sections; and
i is equal to j.

14. A method for producing a semiconductor optical device, comprising the steps of:
forming a semiconductor region including a semiconductor layer on a substrate, the substrate including a principal surface, the principal surface including a device area including device sections arranged in rows and columns;
preparing a mold including a pattern surface, the pattern surface including an arrangement of patterns each including first to n-th pattern portions;
forming a first mask on the semiconductor region with the mold by a nano-imprint technique;
forming first to n-th periodic structures in each of the device sections in the semiconductor region by using the first mask, the first to n-th periodic structures respectively corresponding to the first to n-th pattern portions;
forming a second mask after the first mask is removed, the second mask including a first pattern on an i-th periodic structure ($1 \leq i \leq n$) among the first to n-th periodic structures in a first section of the device sections and including a second pattern on a j-th periodic structure ($1 \leq j \leq n$) among the first to n-th periodic structures in a second section of the device sections;
forming first and second strip mesas in the first and second sections respectively by using the second mask;
forming an insulator layer over the first and second stripe mesas, the insulator layer including openings positioned above the first and second stripe mesas; and
after the formation of the insulator layer over the first and second stripe mesas, forming first and second electrodes on the one or more semiconductor layers in accordance with positions of the i-th and j-th periodic structures, wherein
the first to n-th periodic structures are arranged adjacent to one another in a direction of the rows; and
the first to n-th periodic structures each extend in a direction of the columns.

* * * * *